United States Patent
Guo et al.

(10) Patent No.: US 7,741,885 B1
(45) Date of Patent: Jun. 22, 2010

(54) FREQUENCY MULTIPLIER

(75) Inventors: Sam Y. Guo, Canton, MI (US);
Xiaopeng Wang, Canton, MI (US)

(73) Assignee: Yazaki North America, Canton, MI (US)

( * ) Notice: Subject to any disclaimer, the term of this patent is extended or adjusted under 35 U.S.C. 154(b) by 0 days.

(21) Appl. No.: 12/397,613

(22) Filed: Mar. 4, 2009

(51) Int. Cl.
*H03B 19/00* (2006.01)

(52) U.S. Cl. ............ 327/116; 327/119; 377/47

(58) Field of Classification Search ........ 327/113, 327/114, 116, 119–123; 377/47, 48
See application file for complete search history.

(56) References Cited

U.S. PATENT DOCUMENTS

| | | | |
|---|---|---|---|
| 3,970,954 A * | 7/1976 | Even | 331/53 |
| 4,339,722 A * | 7/1982 | Sydor et al. | 377/47 |
| 4,851,709 A * | 7/1989 | Bailey | 327/116 |
| 6,346,833 B1 * | 2/2002 | Kuroki | 327/119 |
| 6,480,045 B2 | 11/2002 | Albean | |
| 6,998,807 B2 | 2/2006 | Phillips et al. | |
| 7,075,346 B1 | 7/2006 | Hariman et al. | |
| 7,126,290 B2 | 10/2006 | Elliott | |
| 7,154,276 B2 | 12/2006 | Bertness | |
| 7,253,574 B2 | 8/2007 | Su et al. | |
| 7,327,051 B2 | 2/2008 | Ito et al. | |
| 7,394,299 B2 * | 7/2008 | Wadhwa et al. | 327/116 |
| 7,414,443 B2 | 8/2008 | Jacobsson et al. | |

* cited by examiner

*Primary Examiner*—Lincoln Donovan
*Assistant Examiner*—Patrick O'Neill
(74) *Attorney, Agent, or Firm*—Harness, Dickey & Pierce, P.L.C.

(57) ABSTRACT

A device for modifying an input signal having an input signal frequency and a duty cycle is disclosed. The device determines two separate counts for each of the high and low pulses of the input signal. One of the two counts for each of the high and low pulses is divided. The divided count is then compared with the undivided count. Based on this comparison, an output module outputs an output signal that has the same duty cycle as the input signal but at a frequency that is a multiple of the input signal frequency.

20 Claims, 4 Drawing Sheets

FREQUENCY MULTIPLIER

FIELD

The present disclosure relates to a frequency multiplier and, more particularly, to a device for multiplying the frequency of a control signal to obtain an output signal with similar characteristics, e.g., duty cycle, to the control signal.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Control modules in vehicles typically have multi-channel power outputs to drive multiple loads. For example, a chassis control module may drive various chassis loads, such as a fuel pump, damper, power steering and electronic brake. One disadvantage associated with this arrangement is that some or all of the loads may be located far from the control module, which requires a longer line through which to deliver a power signal. An increase in the length of a power line not only results in power loss, but also sensitivity to electromagnetic interference ("EMI"). In order to avoid long transmission of power signals, a power module may be located on or proximate to the load. The power module may then be controlled by control signals sent from the control module. In this manner, only the control signals need to travel the relatively long distance between the load and control module.

Typical chassis loads are controlled by high frequency (such as 20 KHz), pulse-width modulated ("PWM") control signals. Such high-frequency PWM signals are susceptible to EMI when sent over long distances. Furthermore, the duty-cycle of these PWM control signals may be severely distorted if required to travel over long distances.

It would be desirable to provide for a control module that allows for the transmission of lower frequency PWM signals that are then modified into high frequency control signals at the load in order to reduce the issues identified above.

SUMMARY

In accordance with various embodiments of the present disclosure, a device for modifying an input signal having an input signal frequency and a duty cycle is disclosed. The device includes a clock that outputs a clock signal at a clock frequency and a pulse counter that receives the clock signal and the input signal. The pulse counter determines a first low pulse count corresponding to the input signal being at a low state and a first high pulse count corresponding to the input signal being at a high state. The device further includes a count divider that modifies the first low pulse count to obtain a divided first low pulse count and that modifies the first high pulse count to obtain a divided first high pulse count. A low pulse counter receives the clock signal and determines a second low pulse count corresponding to the input signal being at the low state. A high pulse counter receives the clock signal and determines a second high pulse count corresponding to the input signal being at the high state. The device also includes a low pulse comparator that compares the divided first low pulse count with the second low pulse count and outputs a low pulse comparison signal when the divided first low pulse count and the second low pulse count are equal. A high pulse comparator compares the divided first high pulse count with the second high pulse count and outputs a high pulse comparison signal when the divided first high pulse count and the second high pulse count are equal. An output module of the device receives the low pulse comparison signal and high pulse comparison signal and outputs an output signal having the duty cycle of the input signal and an output signal frequency that is a multiple of the input signal frequency.

In accordance with various embodiments of the present disclosure, a device for modifying an input signal having an input signal frequency and a duty cycle is disclosed. The device includes a clock that outputs a clock signal at a clock frequency and a frequency divider that modifies the clock signal to obtain a divided frequency clock signal. A pulse counter receives the divided frequency clock signal and the input signal. Based on these inputs, the pulse counter determines a divided low pulse count corresponding to the input signal being at a low state and a divided high pulse count corresponding to the input signal being at a high state. The device also includes a low pulse counter that receives the clock signal and determines a low pulse count corresponding to the input signal being at the low state. The device further includes a high pulse counter that receives the clock signal and determines a high pulse count corresponding to the input signal being at the high state. A low pulse comparator compares the divided low pulse count with the low pulse count and outputs a low pulse comparison signal when the divided low pulse count and the low pulse count are equal. A high pulse comparator compares the divided high pulse count with the high pulse count and outputs a high pulse comparison signal when the divided high pulse count and the high pulse count are equal. An output module receives the low pulse comparison signal and high pulse comparison signal and outputs an output signal having the duty cycle of the input signal and an output signal frequency that is a multiple of the input signal frequency.

In accordance with various embodiments of the present disclosure, a method for modifying an input signal having an input signal frequency and a duty cycle is disclosed. The method includes providing a clock signal at a clock frequency, determining a divided low pulse count corresponding to the input signal being at a low state and determining a divided high pulse count corresponding to the input signal being at a high state. The method further includes determining a low pulse count corresponding to the input signal being at the low state and determining a high pulse count corresponding to the input signal being at the high state. The divided low pulse count is compared with the low pulse count, and the divided high pulse count is compared with the high pulse count. A low pulse comparison signal is output when the divided low pulse count and the low pulse count are equal. A high pulse comparison signal is output when the divided high pulse count and the high pulse count are equal. The method also includes outputting an output signal having the duty cycle of the input signal and an output signal frequency that is a multiple of the input signal frequency based on the high pulse comparison signal and the low pulse comparison signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
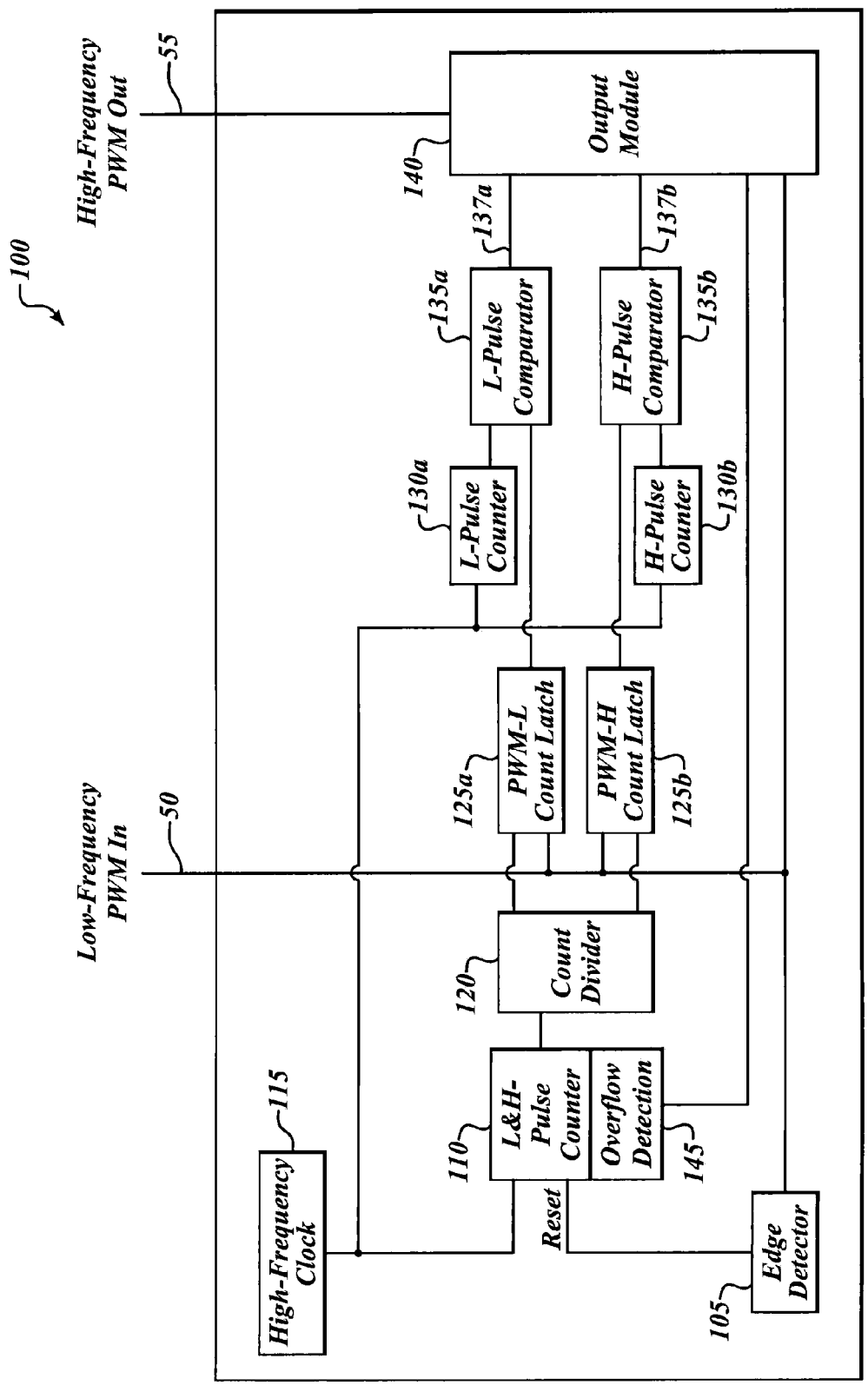
FIG. 1 is a schematic block diagram of a device for multiplying the frequency of a low frequency pulse-width modulated signal according to various embodiments of the present disclosure.
Figure 2:
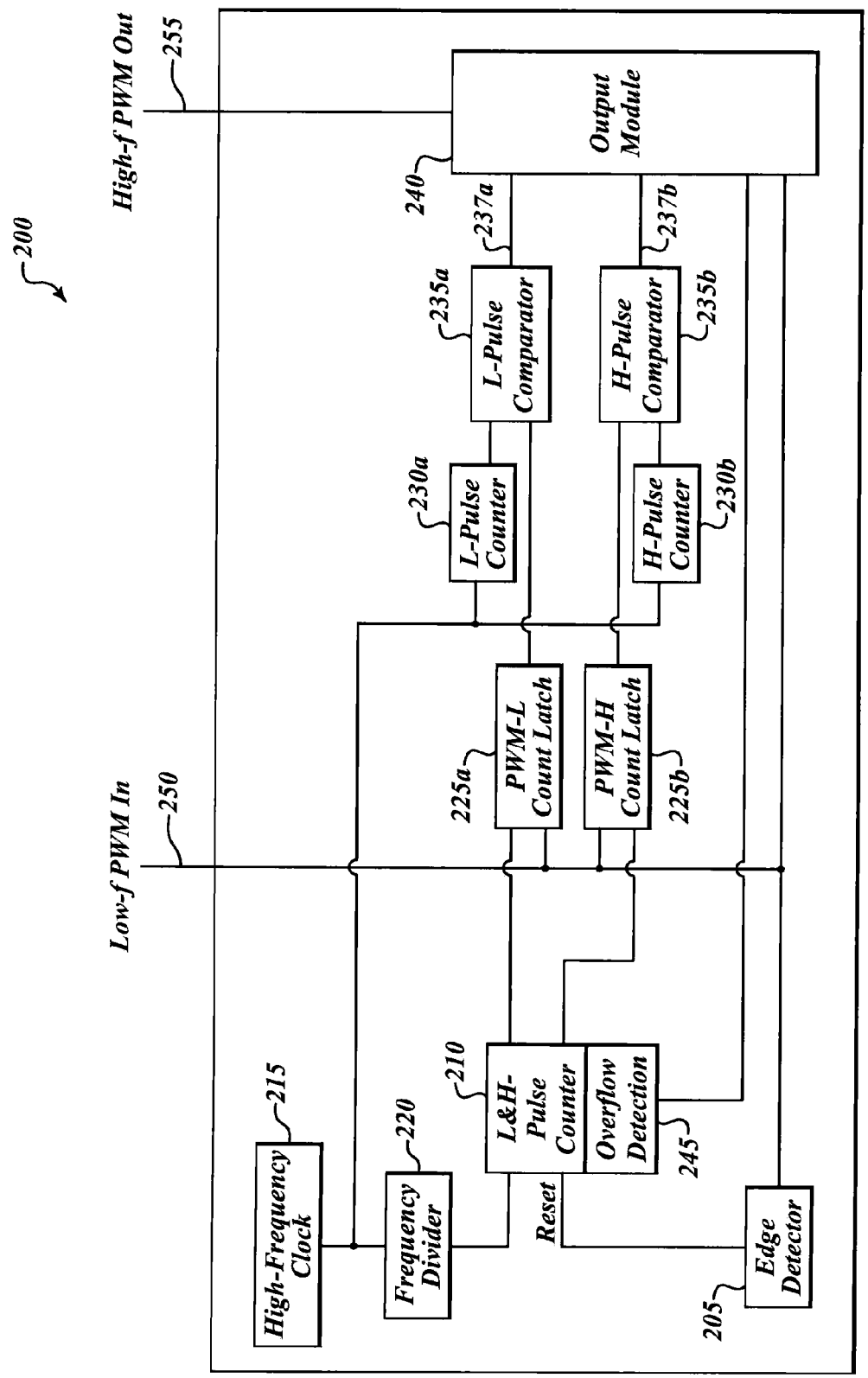
FIG. 2 is a schematic block diagram of a device for multiplying the frequency of a low frequency pulse-width modulated signal according to various embodiments of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

A device for multiplying the frequency of a low frequency pulse-width modulated ("PWM") signal according to various embodiments of the present disclosure is illustrated in FIG. 1. An input signal 50 is received by the device 100. Device 100 modifies the input signal 50 and outputs output signal 55. Output signal 55 has essentially the same characteristics (duty cycle, etc.) as input signal 50, but at a multiplied frequency. For example only, input signal 50 may comprise a PWM signal with a frequency of 80 Hz and output signal 55 may be a 20 KHz PWM signal with the same duty cycle as input signal 50. The output PWM signal may be used to as a control signal to a chassis control module for a vehicle.

Input signal 50 is received by an edge detector 105. Edge detector 105 detects the transitions between states or "edges" of PWM input signal 50 and outputs a logical high signal upon detection of an edge. The output of edge detector 105 is received by the reset input of pulse counter 110. Pulse counter 110 further receives a clock signal from clock 115. Pulse counter 110 counts each high and low pulse of input signal 50. Pulse counter 110 continually counts until reset by receipt of a logical high signal from edge detector 105, which resets pulse counter 110. The count that is output from pulse counter 110 is divided by a count divider 120. Count divider 120 modifies the count received from pulse counter 110 by dividing it by a number n to obtain a divided count. The divided count is received by a low pulse count latch 125a and a high pulse count latch 125b. Low and high pulse count latches 125a, 125b also receive the input signal 50. When the input signal 50 is low, low pulse count latch 125a will store the divided count to obtain a divided low pulse count. When the input signal 50 is high, high pulse count latch 125b will store the divided count to obtain a divided high pulse count.

The clock signal is further received by low pulse counter 130a and high pulse counter 130b. Low pulse counter 130a determines a low pulse count, and high pulse counter 130b determines a high pulse count. A low pulse comparator 135a compares the low pulse count output by low pulse counter 130a with the divided low pulse count output by low pulse count latch 125a. When the low pulse count and divided low pulse count are equal, low pulse comparator 135a outputs a logical high signal on line 137a to output module 140. Output module 140 will output a high signal as output signal 55 when it receives a high signal on line 137a.

Similar to low pulse comparator 135a above, a high pulse comparator 135b compares the high pulse count output by high pulse counter 130b with the divided high pulse count output by high pulse count latch 125b. When the high pulse count and divided high pulse count are equal, high pulse comparator 135b outputs a logical high signal on line 137b to output module 140. Output module 140 will output a low signal as output signal 55 when it receives a high signal on line 137b. In the manner described above, device 100 will output an output signal 55 that has the same duty cycle as input signal 50, but at a frequency equal to the frequency of the input signal 50 multiplied by n.

Device 100 operates based on the detection of edges in the input signal 50. If the input signal has a 0% or 100% duty cycle, the edge detector 105 will not detect any edges in the input signal 50 and, thus, will not provide a reset signal to pulse counter 110. As a result, pulse counter 110 will enter an overflow condition. Overflow detection module 145 will detect an overflow condition and output an overflow signal to output module 140. Based on the overflow signal and input signal 50, output module 140 will output either a constant low or constant high signal corresponding to the state of input signal 50 during the overflow condition.

A device 200 for multiplying the frequency of a PWM signal according to various alternative embodiments of the present disclosure is illustrated in FIG. 1. An input signal 250 is received by the device 200. Device 200 modifies the input signal 250 and outputs output signal 255. Output signal 255 has essentially the same characteristics (duty cycle, etc.) as input signal 250, but at a multiplied frequency. For example only, input signal 250 may comprise a PWM signal with a frequency of 80 Hz and output signal 255 may be a 20 KHz PWM signal with the same duty cycle as input signal 250. The output PWM signal may be used to as a control signal to a chassis control module for a vehicle.

Input signal 250 is received by an edge detector 205. Edge detector 205 detects the transitions between states or "edges" of PWM input signal 250 and outputs a logical high signal upon detection of an edge. The output of edge detector 205 is received by the reset input of pulse counter 210. Pulse counter 210 further receives a divided frequency clock signal from clock 215 and frequency divider 220. Frequency divider 220 divides the frequency of the clock signal output by clock 215 by a number n to obtain the divided frequency clock signal. Based on these inputs, pulse counter 210 counts each high and low pulse of input signal 250. Pulse counter 210 continually counts until reset by receipt of a logical high signal from edge detector 205, which resets pulse counter 210. The output from pulse counter 210 is substantially similar to the output of count divider 120 in device 100 described above. In device 100, the pulse counter 110 counts pulses at a clock frequency and the count is then divided by n by count divider 120 to obtain a divided count. In device 200, the pulse counter counts at a clock frequency that has been divided by n to obtain the divided count. If the clock frequency and n value are the same, the divided counts (that is, the outputs from pulse counter 210 and count divider 120) should also be the same.

The remaining portion of device 200 operates substantially similar to device 100. The divided count is received by a low pulse count latch 225a and a high pulse count latch 225b. Low and high pulse count latches 225a, 225b also receive the input signal 250. When the input signal 250 is low, low pulse count latch 225a will store the divided count to obtain a divided low pulse count. When the input signal 250 is high, high pulse count latch 225b will store the divided count to obtain a divided high pulse count.

The clock signal output from clock 215 is received by low pulse counter 230a and high pulse counter 230b. Low pulse counter 230a determines a low pulse count, and high pulse counter 230b determines a high pulse count. A low pulse comparator 235a compares the low pulse count output by low pulse counter 230a with the divided low pulse count output by low pulse count latch 225a. When the low pulse count and divided low pulse count are equal, low pulse comparator 235a outputs a logical high signal on line 237a to output module 240. Output module 240 will output a high signal as output signal 255 when it receives a high signal on line 237a.

Similar to low pulse comparator 235a above, a high pulse comparator 235b compares the high pulse count output by high pulse counter 230b with the divided high pulse count output by high pulse count latch 225b. When the high pulse count and divided high pulse count are equal, high pulse comparator 235b outputs a logical high signal on line 237b to output module 240. Output module 240 will output a low signal as output signal 255 when it receives a high signal on line 237b. In the manner described above, device 200 will output an output signal 255 that has the same duty cycle as input signal 250, but at a frequency equal to the frequency of the input signal 250 multiplied by n.

Device 200 operates based on the detection of edges in the input signal 250. If the input signal has a 0% or 100% duty cycle, the edge detector 205 will not detect any edges in the input signal 250 and, thus, will not provide a reset signal to pulse counter 210. As a result, pulse counter 210 will enter an overflow condition. Overflow detection module 245 will detect an overflow condition and output an overflow signal to output module 240. Based on the overflow signal and input signal 250, output module 240 will output either a constant low or constant high signal corresponding to the state of input signal 250 during the overflow condition.

Figure 3A:
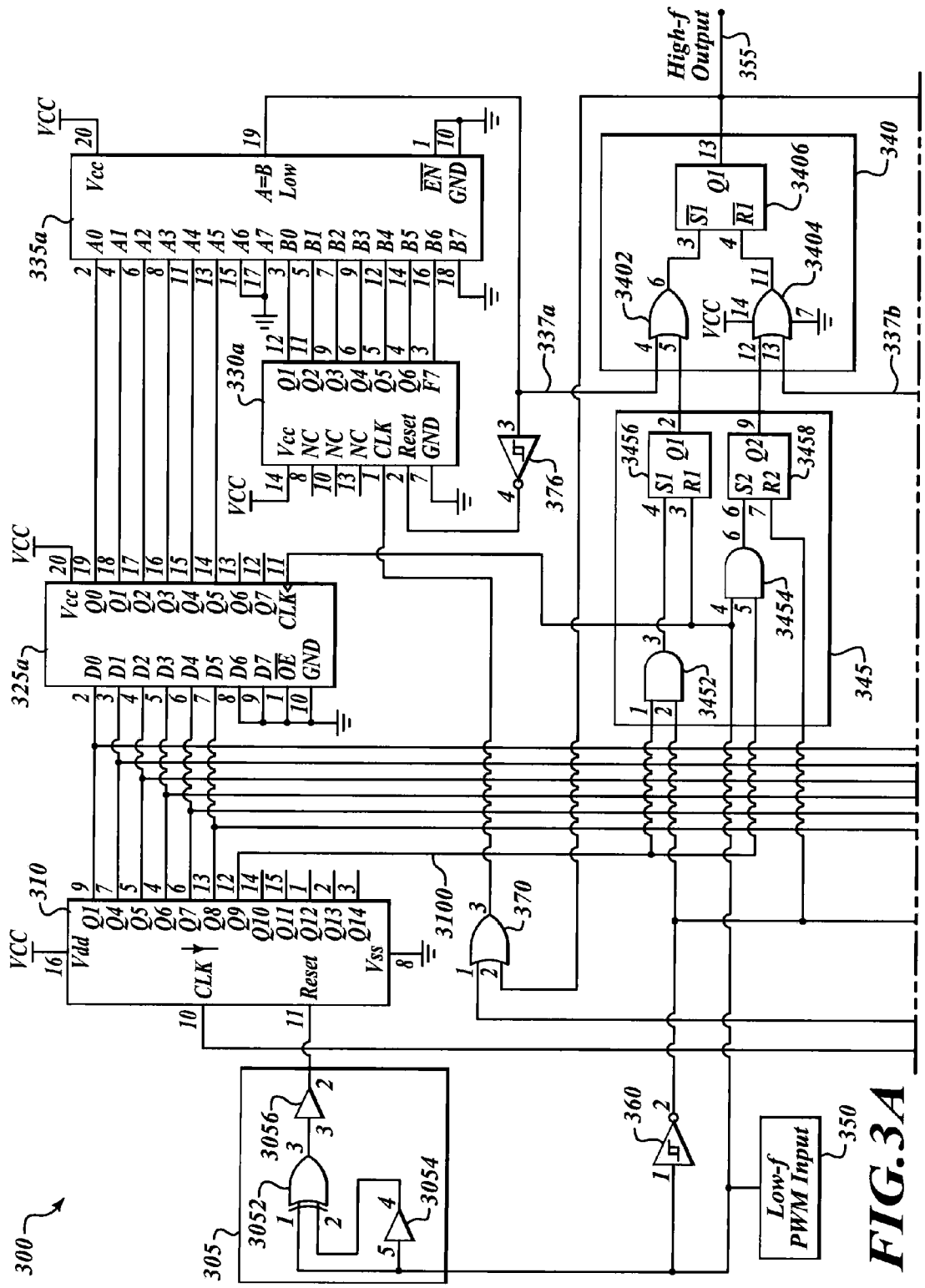
FIGS. 3A and 3B are a circuit diagram of an exemplary device for multiplying the frequency of a pulse-width modulated signal according to various embodiments of the present disclosure.
Figure 3B:
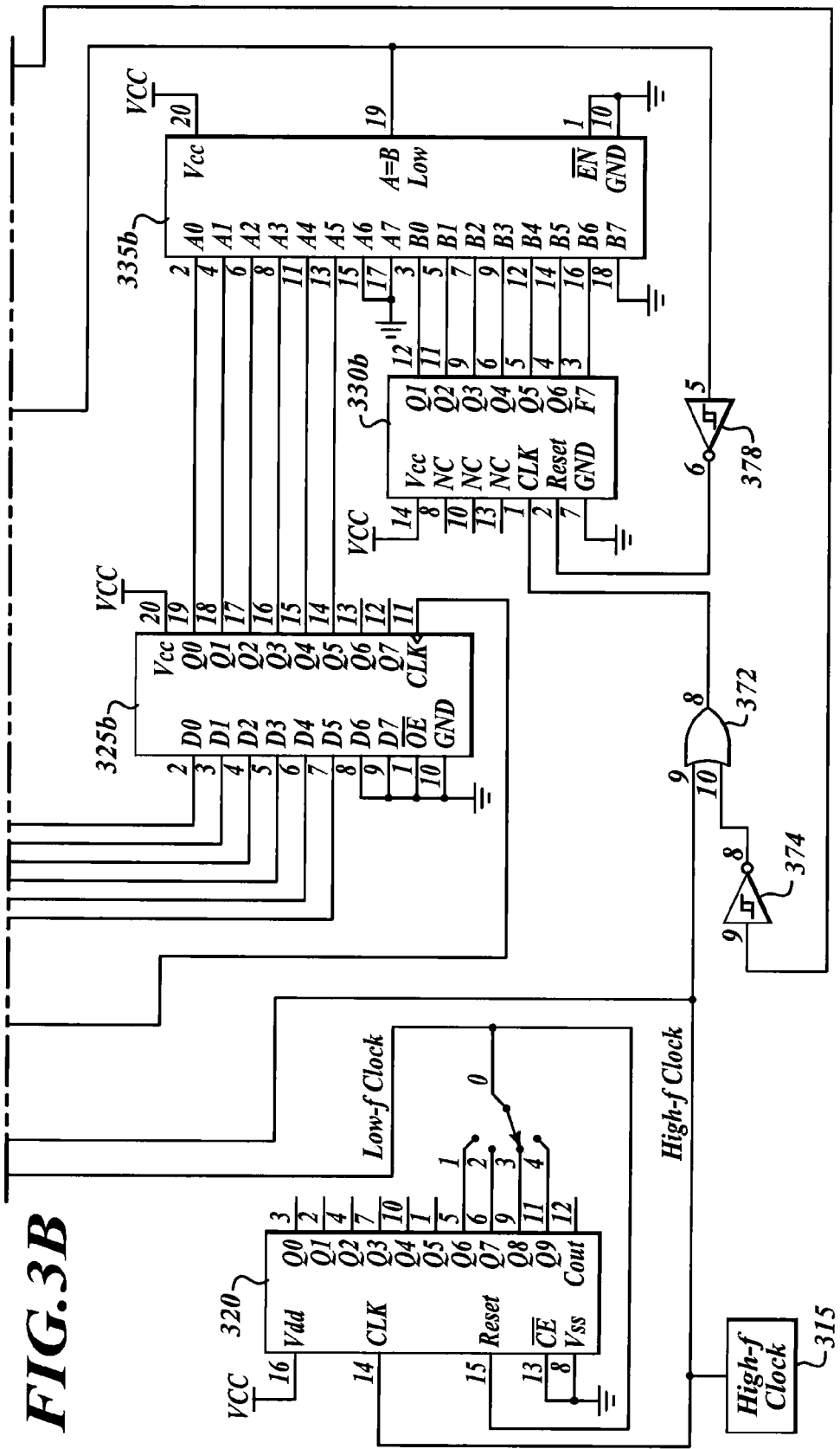

A circuit diagram of an exemplary device for multiplying the frequency of a PWM signal according to various alternative embodiments of the present disclosure is illustrated in FIGS. 3A and 3B. The circuit 300 illustrates one configuration for implementing the device 200 described above.

An input signal 350 is received by the device. Input signal 350 is received by an edge detector 305, which detects the transitions between states or "edges" of PWM input signal 350. Edge detector 305 comprises an XOR gate 3052, and two buffers 3054 and 3056. XOR gate 3052 receives as its inputs the input signal 350 and the input signal that is first buffered by buffer 3054. The output of XOR gate 3052 is buffered by buffer 3056. Buffer 3056 delays the output of XOR gate 3052 to ensure that latches 325a and 325b may latch appropriately before pulse counter 310 is reset, as described below. In this manner, edge detector 305 outputs a logical high signal upon detection of an edge of input signal 350.

The output of edge detector 305 is received by the reset input of pulse counter 310. Pulse counter 310 further receives a divided frequency clock signal from clock 315 and frequency divider 320. Frequency divider 320 divides the frequency of the clock signal output by clock 315 by a number n to obtain the divided frequency clock signal. Frequency divider 320 may comprise a decade counter, such as a 4017 integrated circuit that is configured as illustrated. Based on these inputs, pulse counter 310 counts each high and low pulse of input signal 350. Pulse counter 310 continually counts until reset by receipt of a logical high signal from edge detector 305, which resets pulse counter 310. The output from pulse counter 310 is substantially similar to the output of count divider 120 in device 100 described above. In device 100, the pulse counter 110 counts pulses at a clock frequency and the count is then divided by n by count divider 120 to obtain a divided count. In circuit 300, the pulse counter counts at a clock frequency that has been divided by n to obtain the divided count. If the clock frequency and n value are the same, the divided counts (that is, the outputs from pulse counter 310 and count divider 120) should also be the same.

The divided count is received by a low pulse count latch 325a and a high pulse count latch 325b. Low and high pulse count latches 325a, 325b may comprise a 14-stage binary counter, such as a 74HC4020 integrated circuit that is configured as illustrated. Low and high pulse count latches 325a, 325b also receive the input signal 350. As shown in FIGS. 3A and 3B, low pulse count latch 325a receives input signal 350 as a clock input, and high pulse count latch 325b receives the output of NOT gate 360 as a clock input. NOT gate 360 receives input signal 350 as an input. When the input signal 350 is low, low pulse count latch 325a will store the divided count to obtain a divided low pulse count. When the input signal 350 is high, high pulse count latch 325b will store the divided count to obtain a divided high pulse count. Low and high pulse count latches 325a and 325b may comprise, for example, a 74HC574 integrated circuit that is configured as illustrated.

The clock signal output from clock 315 is received by low pulse counter 330a and high pulse counter 330b. In the illustrated example, clock signal from clock 315 is first received by OR gates 370 and 372 before being passed to low pulse counter 330a and high pulse counter 330b, respectively. OR gate 370 receives as its other input the output signal 355. OR gate 372 receives as its other input the output signal 355 after being processed by NOT gate 374. The clock signal, after being processed as described above, is input to the clock input of low pulse counter 330a and high pulse counter 330b. Furthermore, low pulse counter 330a receives at its reset input the output of low pulse comparator 335a after first being processed by NOT gate 376. Similarly, high pulse counter 330b receives at its reset input the output of high pulse comparator 335b after first being processed by NOT gate 378. In this manner, low pulse counter 330a determines a low pulse count, and high pulse counter 330b determines a high pulse count. Low and high pulse counters 330a and 330b may comprise, for example, a 74HC4024 integrated circuit that is configured as illustrated.

A low pulse comparator 335a compares the low pulse count output by low pulse counter 330a with the divided low pulse count output by low pulse count latch 325a. When the low pulse count and divided low pulse count are equal, low pulse comparator 335a outputs a signal 337a to output module 340. Output module 340 will output a high signal as output signal 355 when it receives a logical high signal on line 337a. Similar to low pulse comparator 335a above, a high pulse comparator 335b compares the high pulse count output by high pulse counter 330b with the divided high pulse count output by high pulse count latch 325b. When the high pulse count and divided high pulse count are equal, high pulse comparator 335*b* outputs a high signal on line 337*b* to output module 340. Output module 340 will output a low signal as output signal 355 when it receives a high signal on line 337*b*. Low and high pulse comparators 335*a* and 335*b* may comprise, for example, a 74HC688 integrated circuit that is configured as illustrated.

Output module 340 may comprise two OR gates 3402 and 3404 and SR NAND latch 3406. If the signal on line 337*a* is high, OR gate 3402 will pass a high signal to SR NAND latch 3406, and SR NAND latch 3406 will output a logical low as output signal 355. In contrast, if the signal on line 337*b* is high, OR gate 3404 will pass a high signal to SR NAND latch 3406, and SR NAND latch 3406 will output a logical high as output signal 355. In the manner described above, circuit 300 will output an output signal 355 that has the same duty cycle as input signal 350, but at a frequency equal to the frequency of the input signal 350 multiplied by n.

Circuit 300 operates based on the detection of edges in the input signal 350. If the input signal has a 0% or 100% duty cycle, the edge detector 305 will not detect any edges in the input signal 350 and, thus, will not provide a reset signal to pulse counter 310. As a result, pulse counter 310 will enter an overflow condition. Overflow detection module 345 will detect an overflow condition and output an overflow signal to output module 340. Based on the overflow signal and input signal 350, output module 340 will output either a constant low or constant high signal corresponding to the state of input signal 350 during the overflow condition.

Overflow module 345 may comprise two AND gates 3452 and 3454 and two SR latches 3456 and 3458. As its inputs, AND gate 3452 receives the overflow output 3100 from pulse counter 310 and the input signal 350 after being processed by NOT gate 360. Thus, when input signal 350 is logical low and pulse counter 310 is in overflow condition, thus outputting a logical high on overflow output 3100, AND gate 3452 provides a logical high output to the S input of SR latch 3456. SR latch 3456 will receive input signal 350, which is at logical low condition, as R input and, thus, output logical high to output module 340. OR gate 3402 receives the output of SR latch 3456 and, as described above, causes output signal 355 to remain at the low state.

When input signal 350 is logical high and pulse counter 310 is in overflow condition, thus outputting a logical high on overflow output 3100, AND gate 3454 provides a logical high output to the S input of SR latch 3458. SR latch 3458 will receive the input signal 350 after being processed by NOT gate 360, which is at logical low condition, as R input and, thus, output logical high to output module 340. OR gate 3404 receives output of SR latch 3458 and, as described above, causes output signal 355 to remain at the high state.

The above disclosure may be particularly relevant to the control of loads that are based on high frequency PWM signals, such as chassis loads. Based on this disclosure, a control module may output a low frequency PWM control signal, which can be modified at or near the load to a high frequency PWM control signal without loss of relevant features, such as duty cycle. A low frequency PWM signal is less sensitive to the EMI and power loss associated with long distance transmission when compared to a high frequency PWM signal. In this manner, a control modules can be located a relatively long distance from the loads to be controlled.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A device for modifying an input signal having an input signal frequency and a duty cycle, comprising:
    a clock that outputs a clock signal at a clock frequency;
    a pulse counter that receives the clock signal and the input signal, wherein the pulse counter determines a first low pulse count corresponding to the input signal being at a low state and a first high pulse count corresponding to the input signal being at a high state;
    a count divider that modifies the first low pulse count to obtain a divided first low pulse count and that modifies the first high pulse count to obtain a divided first high pulse count;
    a low pulse counter that receives the clock signal, wherein the low pulse counter determines a second low pulse count corresponding to the input signal being at the low state;
    a high pulse counter that receives the clock signal, wherein the high pulse counter determines a second high pulse count corresponding to the input signal being at the high state;
    a low pulse comparator that compares the divided first low pulse count with the second low pulse count, wherein the low pulse comparator outputs a low pulse comparison signal when the divided first low pulse count and the second low pulse count are equal;
    a high pulse comparator that compares the divided first high pulse count with the second high pulse count, wherein the high pulse comparator outputs a high pulse comparison signal when the divided first high pulse count and the second high pulse count are equal; and
    an output module that receives the low pulse comparison signal and high pulse comparison signal and outputs an output signal having the duty cycle of the input signal and an output signal frequency that is a multiple of the input signal frequency.

2. The device of claim 1, further comprising an overflow module operably connected to the pulse counter and the output module, wherein the overflow module detects an overflow condition and directs the output module to output either a logical HIGH signal or logical LOW signal as the output signal based on the input signal.

3. The device of claim 2, wherein the input signal received by the pulse counter is first processed by an edge detector that detects an edge of the input signal and outputs a reset signal to the pulse counter upon detection of the edge.

4. The device of claim 2, further comprising a low pulse count latch and a high pulse count latch, wherein the low pulse count latch latches the divided first low pulse count and the high pulse count latch latches the divided first high pulse count.

5. The device of claim 1, wherein the input signal received by the pulse counter is first processed by an edge detector that detects an edge of the input signal and outputs a reset signal to the pulse counter upon detection of the edge.

6. The device of claim 1, further comprising a low pulse count latch and a high pulse count latch, wherein the low pulse count latch latches the divided first low pulse count and the high pulse count latch latches the divided first high pulse count.

7. A device for modifying an input signal having an input signal frequency and a duty cycle, comprising:
    a clock that outputs a clock signal at a clock frequency;

a frequency divider that modifies the clock signal to obtain a divided frequency clock signal;

a pulse counter that receives the divided frequency clock signal and the input signal, wherein the pulse counter determines a divided low pulse count corresponding to the input signal being at a low state and a divided high pulse count corresponding to the input signal being at a high state;

a low pulse counter that receives the clock signal, wherein the low pulse counter determines a low pulse count corresponding to the input signal being at the low state;

a high pulse counter that receives the clock signal, wherein the high pulse counter determines a high pulse count corresponding to the input signal being at the high state;

a low pulse comparator that compares the divided low pulse count with the low pulse count, wherein the low pulse comparator outputs a low pulse comparison signal when the divided low pulse count and the low pulse count are equal;

a high pulse comparator that compares the divided high pulse count with the high pulse count, wherein the high pulse comparator outputs a high pulse comparison signal when the divided high pulse count and the high pulse count are equal; and an output module that receives the low pulse comparison signal and high pulse comparison signal and outputs an output signal having the duty cycle of the input signal and an output signal frequency that is a multiple of the input signal frequency.

8. The device of claim 7, further comprising an overflow module operably connected to the pulse counter and the output module, wherein the overflow module detects an overflow condition and directs the output module to output either a logical HIGH signal or logical LOW signal as the output signal based on the input signal.

9. The device of claim 8, wherein the input signal received by the pulse counter is first processed by an edge detector that detects an edge of the input signal and outputs a reset signal to the pulse counter upon detection of the edge.

10. The device of claim 8, further comprising a low pulse count latch and a high pulse count latch, wherein the low pulse count latch latches the divided low pulse count and the high pulse count latch latches the divided high pulse count.

11. The device of claim 7, wherein the input signal received by the pulse counter is first processed by an edge detector that detects an edge of the input signal and outputs a reset signal to the pulse counter upon detection of the edge.

12. The device of claim 7, further comprising a low pulse count latch and a high pulse count latch, wherein the low pulse count latch latches the divided low pulse count and the high pulse count latch latches the divided high pulse count.

13. A method for modifying an input signal having an input signal frequency and a duty cycle, comprising:

providing a clock signal at a clock frequency;

determining a divided low pulse count corresponding to the input signal being at a low state;

determining a divided high pulse count corresponding to the input signal being at a high state;

determining a low pulse count corresponding to the input signal being at the low state;

determining a high pulse count corresponding to the input signal being at the high state;

comparing the divided low pulse count with the low pulse count;

comparing the divided high pulse count with the high pulse count;

outputting a low pulse comparison signal when the divided low pulse count and the low pulse count are equal;

outputting a high pulse comparison signal when the divided high pulse count and the high pulse count are equal; and outputting an output signal having the duty cycle of the input signal and an output signal frequency that is a multiple of the input signal frequency based on the high pulse comparison signal and the low pulse comparison signal.

14. The method of claim 13, further comprising detecting an overflow condition, wherein the step of outputting the output signal comprises outputting either a logical HIGH signal or logical LOW signal as the output signal based on the input signal when the overflow condition is detected.

15. The method of claim 14, further comprising detecting an edge of the input signal, wherein the divided low pulse count and the divided high pulse count is based on the detection of the edge.

16. The method of claim 14, further comprising latching the divided low pulse count and latching the divided high pulse count.

17. The method of claim 13, further comprising detecting an edge of the input signal, wherein the divided low pulse count and the divided high pulse count is based on the detection of the edge.

18. The method of claim 13, further comprising latching the divided low pulse count and latching the divided high pulse count.

19. The method of claim 13, wherein the step of determining the divided low pulse count comprises determining an undivided low pulse count and dividing the undivided low pulse count.

20. The method of claim 13, wherein the step of determining the divided low pulse count comprises frequency dividing the clock signal to obtain a divided frequency clock signal and determining the divided low pulse count based on the divided frequency clock signal.

* * * * *